United States Patent
Chang et al.

(10) Patent No.: US 6,744,277 B1
(45) Date of Patent: Jun. 1, 2004

(54) PROGRAMMABLE CURRENT REFERENCE CIRCUIT

(75) Inventors: Wanli Chang, Saratoga, CA (US); Gregory W. Starr, San Jose, CA (US)

(73) Assignee: Altera Corporation, San Jose, CA (US)

( * ) Notice: Subject to any disclaimer, the term of this patent is extended or adjusted under 35 U.S.C. 154(b) by 21 days.

(21) Appl. No.: 10/138,685

(22) Filed: May 3, 2002

Related U.S. Application Data

(60) Provisional application No. 60/289,268, filed on May 6, 2001, and provisional application No. 60/289,245, filed on May 6, 2001.

(51) Int. Cl.[7] .............................................. H03L 7/06
(52) U.S. Cl. ........................ 326/37; 326/82; 327/141; 327/144; 327/145; 327/176; 327/291; 327/159
(58) Field of Search ............................ 326/37, 38, 82; 327/284, 287, 288, 159, 147–150, 158; 365/185.2, 185.21

(56) References Cited

U.S. PATENT DOCUMENTS

| | | | |
|---|---|---|---|
| 4,475,208 A | | 10/1984 | Ricketts |
| 4,521,744 A | | 6/1985 | Yamada et al. |
| 5,058,204 A | | 10/1991 | Tahernia et al. |
| 5,144,173 A | * | 9/1992 | Hui ............................ 327/277 |
| 5,256,980 A | | 10/1993 | Itri |
| 5,319,735 A | | 6/1994 | Preuss et al. |
| 5,453,706 A | | 9/1995 | Yee |
| 5,631,920 A | | 5/1997 | Hardin |
| RE35,650 E | | 11/1997 | Partyka et al. |
| 5,712,595 A | | 1/1998 | Yokoyama |
| 5,737,329 A | | 4/1998 | Horiguchi |
| 5,872,807 A | | 2/1999 | Booth et al. |
| 5,898,617 A | * | 4/1999 | Bushey et al. ........... 365/185.2 |
| 5,914,980 A | | 6/1999 | Yokota et al. |
| 6,046,603 A | | 4/2000 | New |
| 6,046,646 A | | 4/2000 | Lo et al. |
| 6,057,704 A | | 5/2000 | New et al. |
| 6,057,739 A | | 5/2000 | Crowley et al. |
| 6,081,164 A | | 6/2000 | Shigemori et al. |
| 6,091,263 A | | 7/2000 | New et al. |
| 6,181,158 B1 | | 1/2001 | Cheung et al. |
| 6,263,011 B1 | | 7/2001 | Paik et al. |
| 6,275,077 B1 | * | 8/2001 | Tobin et al. ................. 327/108 |
| 6,282,249 B1 | | 8/2001 | Tomesen et al. |
| 6,366,174 B1 | | 4/2002 | Berry et al. |
| 6,389,092 B1 | | 5/2002 | Momtaz |
| 6,417,739 B1 | | 7/2002 | Chacko |
| 6,441,660 B1 | | 8/2002 | Ingino, Jr. |
| 6,462,594 B1 | * | 10/2002 | Robinson et al. ........... 327/159 |

FOREIGN PATENT DOCUMENTS

| | | |
|---|---|---|
| EP | 0 655 892 A1 | 5/1995 |
| EP | 1 020 995 A1 | 7/2000 |

OTHER PUBLICATIONS

U.S. patent application Ser. No. 10/137,802, Starr, filed May 1, 2002.

* cited by examiner

*Primary Examiner*—Vibol Tan
(74) *Attorney, Agent, or Firm*—Morrison & Foerster LLP

(57) ABSTRACT

A programmable current reference circuit is described. The programmable current reference circuit includes a programmable resistance, where the programmable resistance is programmable to provide one of a plurality of resistances, where each of the plurality of resistances corresponds to one of a plurality of programmable current reference circuit outputs. In one embodiment, the programmable current reference circuit includes a current source coupled to the programmable resistance. In one embodiment, the plurality of programmable current reference circuit outputs includes a plurality of reference currents. A phase locked loop including the programmable current reference circuit is also described.

39 Claims, 9 Drawing Sheets

PROGRAMMABLE CURRENT REFERENCE CIRCUIT

CROSS-REFERENCE TO RELATED APPLICATIONS

This application claims the benefits of U.S. Provisional Application Serial Nos. 60/289,268 and 60/289,245, filed May 6, 2001, and entitled "Programmable Loop Bandwidth In Phase Locked Loop (PLL) Circuit" and "Phase Lock Loop (PLL) And Delay Lock Loop (DLL) Counter And Delay Element Programming In User Mode", respectively.

This application is being filed concurrently with (1) the U.S. Patent Application of Gregory W. Starr and Wanli Chang for "Programmable Loop Bandwidth In Phase Locked Loop (PLL) Circuit", (2) the U.S. Patent Application of Gregory W. Starr, Yen-Hsiang Chang, and Edward P. Aung for "Phase Locked Loop (PLL) And Delay Locked Loop (DLL) Counter And Delay Element Programming In User Mode", and (3) the U.S. Patent Application of Gregory W. Starr and Wanli Chang for "Analog Implementation of Spread Spectrum Frequency Modulation In A Programmable Phase Locked Loop (PLL) System", and incorporates the material therein by reference.

BACKGROUND OF THE INVENTION

1. Field of the Invention

This invention relates generally to electronic circuits and, in particular, to current reference circuits.

2. Description of the Related Art

Current reference circuits are used in many different contexts. A current reference circuit provides a reference current to another circuit. Existing current reference circuits are not designed to provide one of multiple reference currents. Instead, they are intended to provide a single reference current. This limits the versatility of current reference circuits.

The present invention addresses this and other disadvantages of existing current reference circuits.

SUMMARY OF THE INVENTION

The present invention encompasses a programmable current reference circuit. The programmable current reference circuit includes a programmable resistance, where the programmable resistance is programmable to provide one of a plurality of resistances, where each of the plurality of resistances corresponds to one of a plurality of programmable current reference circuit outputs. In one embodiment, the programmable current reference circuit includes a current source coupled to the programmable resistance. In one embodiment, the plurality of programmable current reference circuit outputs includes a plurality of reference currents.

The present invention also encompasses a phase locked loop circuit. The phase locked loop circuit includes a signal generator and a programmable current reference circuit coupled to said signal generator, where the programmable current reference circuit is programmable to provide one of a plurality of programmable current reference circuit outputs. In one embodiment, the programmable current reference circuit comprises a current source and a programmable resistance coupled to the current source. In one embodiment, the programmable resistance is programmable to provide one of a plurality of resistances, each resistance of the plurality of resistances corresponding to one of the plurality of programmable current reference circuit outputs. In one embodiment, the plurality of programmable current reference circuit outputs includes a plurality of reference currents.

The present invention is explained in more detail below with reference to the drawings.

DETAILED DESCRIPTION OF THE INVENTION

The present invention comprises a programmable current reference circuit. The following description is presented to enable any person skilled in the art to make and use the invention, and is provided in the context of a particular application and its requirements. Various modifications to the embodiments shown will be readily apparent to those skilled in the art, and the generic principles defined herein may be applied to other embodiments and applications without departing from the spirit and scope of the invention. Thus, the present invention is not intended to be limited to the embodiments shown, but is to be accorded the widest scope consistent with the principles and features disclosed herein.

The present invention is primarily described and claimed with reference to a PLL circuit. It is to be noted, however, that PLL and delay locked loop (DLL) circuits are herein used interchangeably. Therefore, references herein to a PLL circuit, either in the description or claims, are not limited to PLL circuits but encompass DLL circuits as well.

Figure 1:
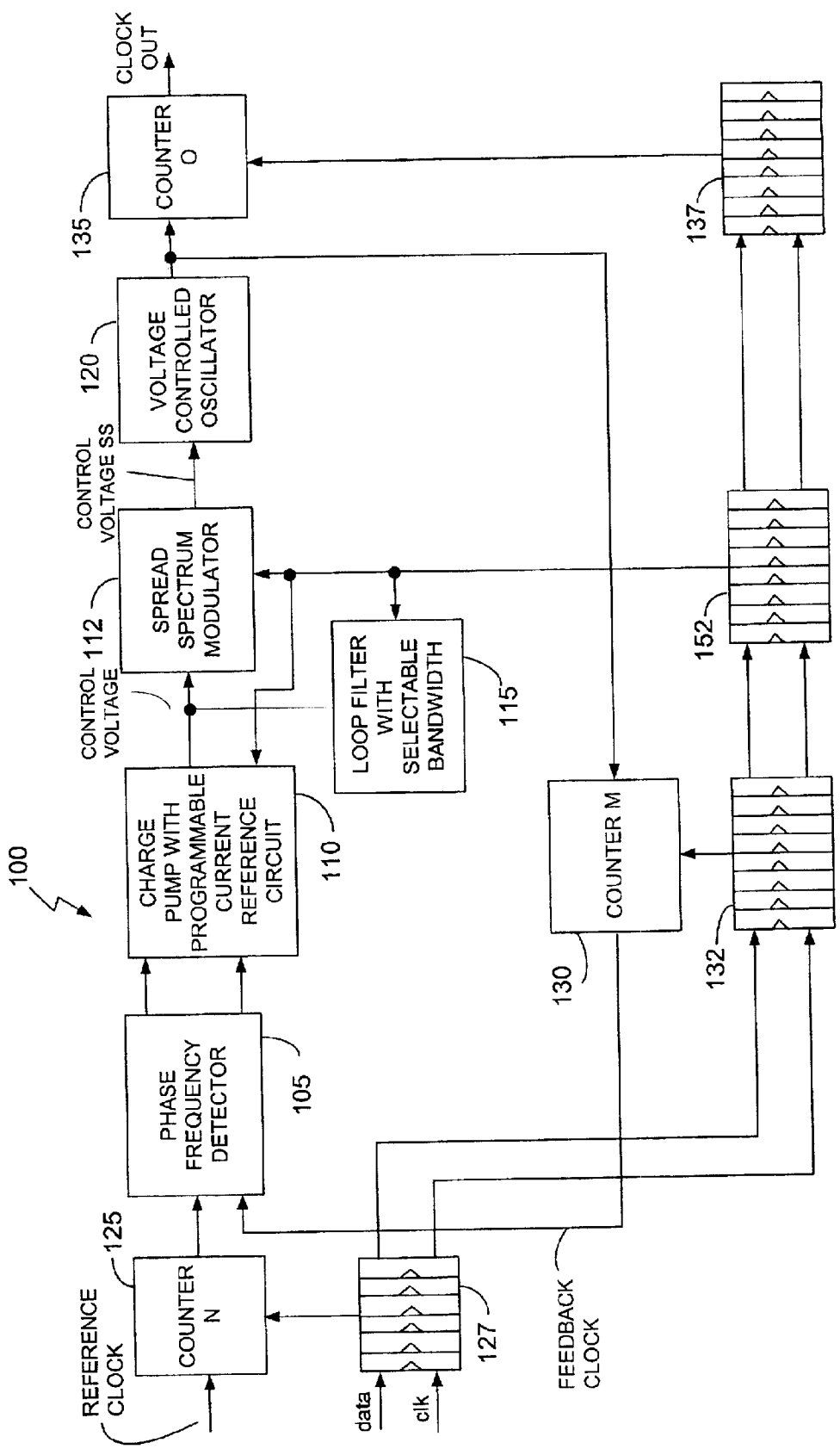
FIG. 1 is a block diagram of one embodiment of the PLL circuit of the present invention.

FIG. 1 is a block diagram of one embodiment of the PLL circuit 100 of the present invention. In FIG. 1, the PLL circuit 100 includes a phase frequency detector (PFD) 105, a charge pump (CP) 110 with a programmable current reference circuit, a spread spectrum modulator 112, a loop filter 115 with a selectable bandwidth, a voltage controlled oscillator (VCO) 120, counter N 125, counter M 130, and counter O 135.

Also shown in FIG. 1 are shift registers 127, 132, 152, and 137, which in one embodiment include D-type flip-flops. Shift registers 127, 132, and 137 are coupled to counter N 125, counter M 130, and counter O 135, respectively. Shift registers 152 may be coupled to the CP 110, the loop filter 115, and the spread spectrum modulator 112. In one embodiment, shift registers 152 are coupled to corresponding hold registers of the CP 110, the loop filter 115, and the spread spectrum modulator 112.

In one embodiment, the spread spectrum modulator 112 is an analog spread spectrum modulator. In one embodiment, the spread spectrum modulator 112 is programmable in user mode using shift registers 152. An analog spread spectrum modulator is described in greater detail in the U.S. Patent Application of Gregory W. Starr and Wanli Chang for "Analog Implementation of Spread Spectrum Frequency Modulation In A Programmable Phase Locked Loop (PLL) System" which is filed concurrently with this application and is incorporated herein by reference. In one embodiment of the PLL circuit 100, the spread spectrum modulator 112 is a digital, rather than an analog, modulator. In yet another embodiment, the PLL circuit 100 of the present invention may be one that does not include the spread spectrum modulator 112.

Figure 2:
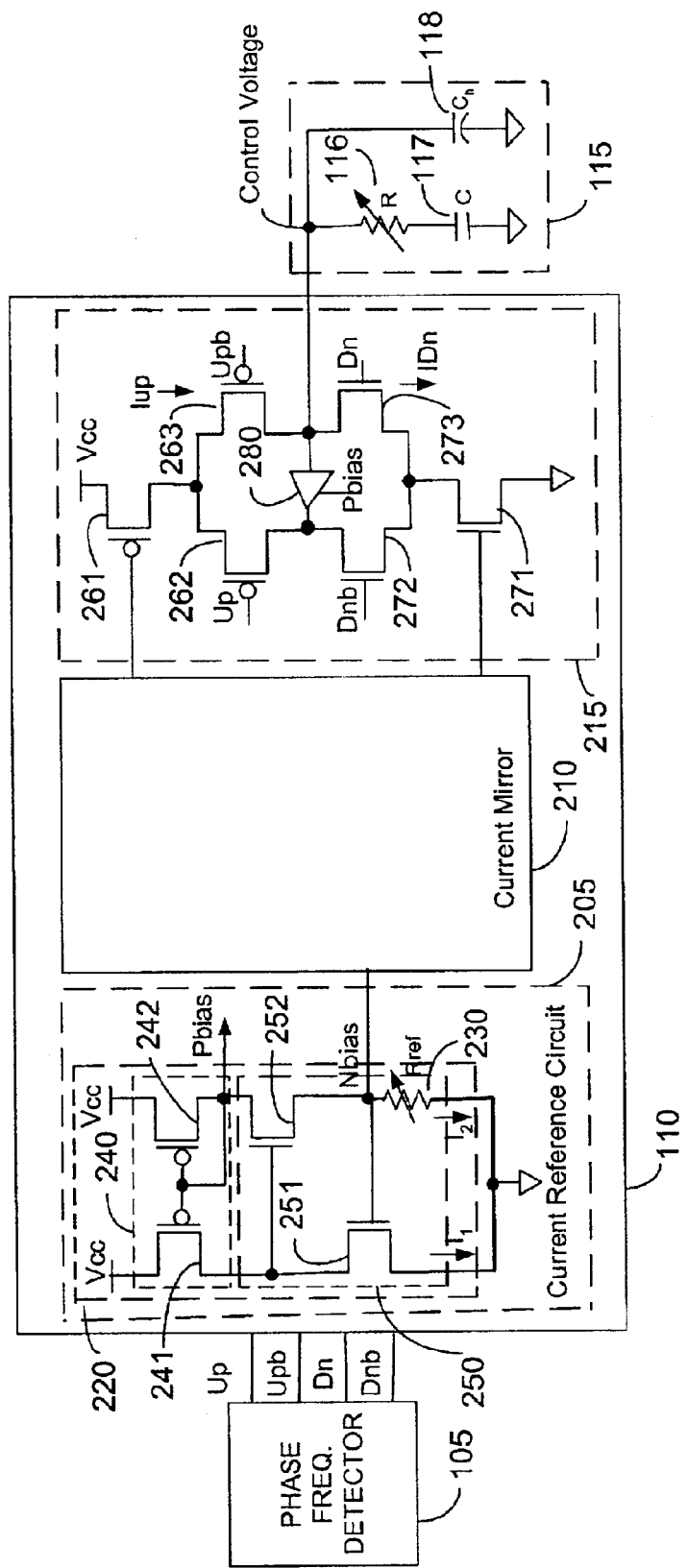
FIG. 2 is a circuit diagram of a portion of the PLL circuit of FIG. 1.

The loop filter 115 with selectable bandwidth may also herein be referred to as a loop filter with programmable bandwidth (or programmable bandwidth loop filter) or a loop filter with variable bandwidth (or variable bandwidth loop filter). In one embodiment, the loop filter 115 is programmable in user mode using shift registers 152. As shown in FIG. 2, in one embodiment, the programmable bandwidth loop filter 115 includes a variable resistor R 116 and capacitors C 117 and $C_h$ 118. In one embodiment, capacitor C 117 has a capacitance that is approximately ten or more times greater than the capacitance of capacitor $C_h$ 118. The U.S. Patent Application of Gregory W. Starr and Wanli Chang for "Programmable Loop Bandwidth In Phase Locked Loop (PLL) Circuit", which is filed concurrently with this application and is incorporated herein by reference, describes such a loop filter with a programmable bandwidth.

As noted in the U.S. Patent Application of Gregory W. Starr and Wanli Chang for "programmable Loop Bandwidth In Phase Locked Loop (PLL) Circuit", use of a variable resistance in the loop filter of the present invention allows varying the bandwidth of the loop filter and, therefore, that of the PLL circuit. More specifically, in one embodiment, it allows shifting the bandwidth of the loop filter. As can be seen in the below open loop gain equation and the corresponding equations for $\tau_z$ and $\tau_p$, both the pole ($\tau_p$) and zero ($\tau_z$) are a function of the resistance of the loop filter:

$$GH(s) = \frac{I_{qp} K_{VCO}}{2\pi M} \frac{1 + s\tau_z}{s^2(C + C_h)(1 + s\tau_p)}; \quad \text{(Eqn. 1)}$$

$$\tau_z = RC; \quad \text{(Eqn. 2)}$$

$$\text{where: } \tau_p = R\left(\frac{1}{C} + \frac{1}{C_h}\right)^{-1}; \quad \text{(Eqn. 3)}$$

$I_{qp}$ is the charge pump current;

$K_{VCO}$ is the gain of the VCO; and

M is the counter value (or divide factor) for the counter M.

Thus, varying the resistance of the loop filter allows moving the pole and zero position. When varying the overall resistance R, the ratio between the zero and pole values will remain the same or substantially the same, but the position of both the zero and pole will change. This allows an effective shift in the open loop bandwidth.

Counters N, M, and O may also be referred to as dividers N, M, and O. The output of each of dividers N, M and O is equal to its respective input divided by N, M, and O, respectively. In one embodiment, each of N, M, and O are integers. In another embodiment, N, M, and O may be non-integers. In one embodiment, each of N, M, and O are equal to one. In another embodiment, the PLL may be without one or more of the dividers N, M, and O. In one embodiment, each of counters N, M, and O and their associated delays may be programmed in user mode, i.e., their count and delay settings may be programmed in user mode. The U.S. Patent Application of Gregory W. Starr, Yen-Hsiang Chang, and Edward P. Aung for "Phase Locked Loop (PLL) And Delay Locked Loop (DLL) Counter And Delay Element Programming In User Mode", which is filed concurrently with this application and is incorporated herein by reference, describes such counters.

The PFD 105 compares the feedback clock signal with a divided version of the reference clock signal, i.e., after the reference clock signal is passed through divider N 125. Depending on the difference between the two signals compared by the PFD 105 (i.e., depending on whether the VCO 120 needs to operate at a higher or lower frequency), either an up or down signal is provided to the charge pump 110. In response, the charge pump 110 increases current supplied to the loop filter 115 or reduces current in the loop filter 115. As a result, a higher or lower control voltage is applied to the spread spectrum modulator 112. The spread spectrum modulator 112 produces a control voltage SS signal, which is a result of the spread spectrum modulation of the control voltage by the spread spectrum modulator 112. The VCO 120 generates a signal (e.g., a waveform) whose frequency depends on the control voltage (or more specifically, the control voltage SS).

FIG. 2 is a more detailed diagram of a portion of one embodiment of the PLL circuit of the present invention. FIG. 2 shows the PFD 105 coupled to the CP 110. As shown in FIG. 2, in one embodiment, the CP 110 includes a programmable current reference circuit 205, a current mirror 210, and a current up/down circuit 215. In one embodiment, the programmable current reference circuit 205 is programmable in user mode using shift registers 152.

Programmable current reference circuit 205 includes current source 220. Current source 220 includes current mirror 240 and a $V_{th}$ (threshold voltage) based current reference 250. Current mirror 240 includes p-channel metal oxide semiconductor (PMOS) transistors 241 and 242. Similarly, $V_{th}$ based current reference 250 includes programmable resistance $R_{ref}$ 230 and n-channel metal oxide semiconductor (NMOS) transistors 251 and 252. Currents $I_1$ and $I_2$, shown in FIG. 2, are equal as they are counterpart currents in current mirror 240. The outputs of the programmable current reference circuit 205 include Pbias and Nbias. As explained below, Pbias is used to control the operational amplifier voltage follower 265. The output Nbias is used as an input to the current mirror 210.

The following equations shows the relationship between the gate-source voltage $V_{GS}$ of NMOS transistor 251, the threshold voltage $V_{th}$ of NMOS transistor 251, the resistance $R_{ref}$, and the current $I_2$:

$$V_{GS} = I_2 R_{ref}; \text{ and} \quad \text{(Eqn. 4)}$$

$$V_{th} + \sqrt{\frac{2I_{sat}}{K}} = I_2 R_{ref}; \quad \text{(Eqn. 5)}$$

$$\text{where } K = \mu C_{ox} \frac{W}{L}. \quad \text{(Eqn. 6)}$$

As can be seen in equation 6 above, K is a function of $\mu$, $C_{OX}$, W and L, where $\mu$ is the mobility of the carrier (i.e., electrons) in the NMOS transistor 251, $C_{OX}$ is the gate oxide capacitance of the NMOS transistor 251, W is the width of the NMOS transistor 251 and L is the length of the NMOS transistor 251. In one embodiment, a large value for K may be accomplished by selecting a large value for W/L. In another embodiment, a large value for K may be accomplished by selecting a large value for $\mu$ and $C_{OX}$. This may, for example, be accomplished by properly selecting the fabrication factors that determine the values of $\mu$ and $C_{OX}$. If $K>>2I_{sat}$, then equation 5 above is reduced to the following:

$$I_2 \cong \frac{V_{th}}{R_{ref}}. \quad \text{(Eqn. 7)}$$

As can be observed from equation 7, by varying $R_{ref}$, the current $I_2$ is also varied. Similarly, by varying $R_{ref}$, the reference voltage at Nbias is also varied. Thus, varying $R_{ref}$ allows varying the reference current or voltage at Nbias. FIGS. 3–5, 6b, and 7b show different embodiments of the programmable $R_{ref}$ of the present invention. As explained below, varying the reference current or voltage at Nbias allows varying the bandwidth of the loop filter 115.

Current mirror 210 is a conventional current mirror used in charge pump circuits of PLL's. In order to avoid cluttering the present application with details of conventional components, current mirror 210 is shown as a block diagram rather than in detail. The reference current $I_2$ at Nbias is input to the current mirror 210. Transistors in current mirror 210 form current mirrors with transistor 251. In response to the current $I_2$, the current mirror 210 applies an output to the current up/down circuit 215. The current $I_2$ and the currents in current up/down circuit 215, more specifically currents in transistors 261 and 271, are also mirrored indirectly through current mirror 210. Accordingly, when $I_2$ is increased, the current through transistors 261 and 271 is also increased. Similarly, when $I_2$ is decreased, the current through transistors 261 and 271 is also decreased. Transistors 261 and 271 may also herein be referred to as current sources 261 and 271.

In another embodiment, the reference voltage at Nbias may be used as an input to a current mirror or some other circuit for which Nbias is an input. For example, the reference voltage may be used as an input to drive a delay circuit with a voltage controlled resistance.

The current up/down circuit 215 includes current sources 261 and 271 which are used to charge or discharge capacitors in the loop filter 115, respectively. Increasing the currents through current sources 261 and 271 increases the rate of charging and discharging, respectively, the capacitors in loop filter 115. Similarly, decreasing the currents through current sources 261 and 271 decreases the rate of charging and discharging, respectively, the capacitors in loop filter 115. The current up/down circuit 215 also includes an operational amplifier voltage follower 280 and current steering switches 262, 263, 272, and 273.

Operational amplifier voltage follower 280 is controlled by Pbias and balances the voltages at its input and output. It thus helps reduce fluctuations in the control voltage as current is steered in current steering switches 262, 263, 272, and 273. In another embodiment, operational amplifier voltage follower 280 may be excluded from current up/down circuit 215.

The gates of current steering switches 262 and 263 are biased by Up and Upb, respectively, which are two of the outputs of the PFD 105. Similarly, the gates of current steering switches 272 and 273 are biased by Dnb and Dn, respectively, which are the remaining two outputs of the PFD 105. Up and Upb are complements. Accordingly, when current steering switch 262 is on, current steering switch 263 is off, and vice versa. Similarly, Dn and Dnb are complements. Accordingly, when current steering switch 272 is on, current steering switch 273 is off, and vice versa When current steering switches 263 and 273 are on and off, respectively, the capacitors in loop filter 115 are charged up by current $I_{Up}$. As a result, the control voltage is increased. When charging the capacitors in loop filter 115, $I_{Up}$ is approximately equal to $I_{qp}$. When current steering switches 263 and 273 are off and on, respectively, the capacitors in loop filter 115 are discharged by current $I_{Dn}$. As a result, the control voltage is decreased. When discharging the capacitors in loop filter 115, $I_{Dn}$ is approximately equal to $I_{qp}$.

When both current switches 263 and 273 are on (which can happen for a short period of time), there is no net charging or discharging of capacitors in the loop filter 115. In such a situation, there is a steady state of $I_{Up}$ and $I_{Dn}$, which are equal to one another. As a result, the control voltage is not increased or decreased. In such a situation, the VCO 120 is locked (i.e., the output of the VCO is locked into the reference clock, more specifically, the reference clock divided by N).

By varying the reference current $I_2$ (through varying $R_{ref}$), the current $I_{qp}$. Supplied to the loop filter 115 may be finely controlled. This fine control over $I_{qp}$ provides fine tuning control over the bandwidth of the PLL, which as can be seen in equation 1 above is a function of $I_{qp}$. It also provides additional control over the stability of the PLL. More specifically, it allows improving the stability of the PLL, which may be improved by controlling some of the factors in equation 1 above, such as $I_{qp}$. Also, the ability to vary the reference current $I_2$ (or the reference voltage) provides more flexibility in overcoming process variations. For example, it provides greater flexibility in overcoming the effects of process variations in $V_{th}$ on the reference current or voltage.

Figure 3:
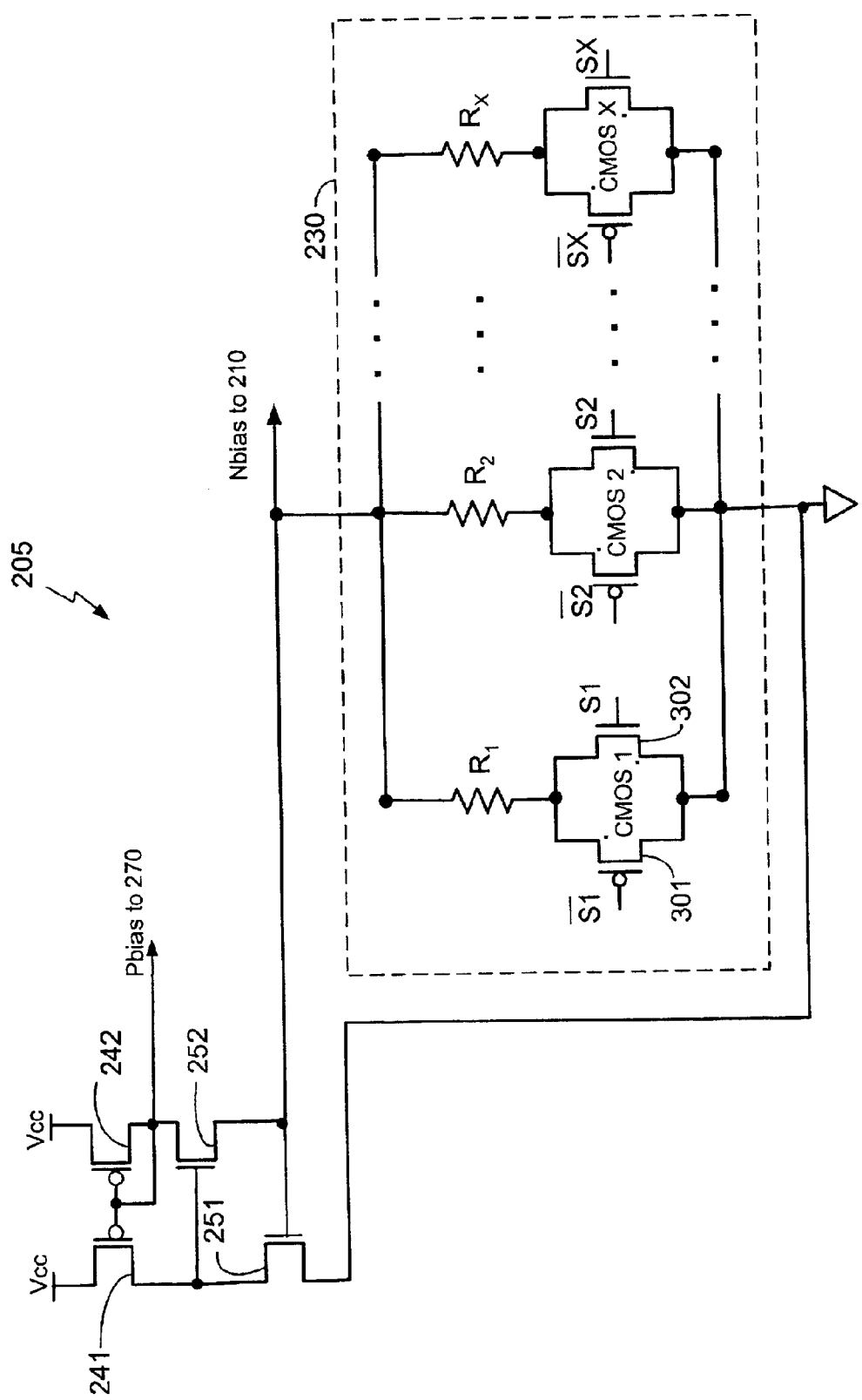
FIG. 3 is a circuit diagram of one embodiment of the programmable current reference circuit of the present invention.

FIG. 3 is a detailed circuit diagram of one embodiment of the programmable current reference circuit 205 of the present invention. In FIG. 3, a number of resistors $R_1$ through $R_X$ are coupled in parallel, where X is an integer and in this specific case is equal to or greater than 3. More generally X is an integer equal to or greater than 2. As can be seen in FIG. 3, each of the resistors R1 through $R_X$ is coupled in series with complementary metal oxide semiconductor (CMOS) transistors, i.e., a combination of an NMOS transistor and a PMOS transistor. Each of the PMOS and NMOS transistors will introduce a series resistance that varies as a function of the control voltage, process, temperature, and voltage supply. By turning on one or more of the appropriate CMOS transistors and turning off the remaining CMOS transistors, a desired overall resistance may be obtained. In one embodiment, each of resistors $R_1$ through $R_X$ has a different resistance. In another embodiment, two or more of the resistors $R_1$ and $R_X$ have the same resistance. Moreover, in one embodiment, the resistance from each CMOS transistor (i.e., the combination of a PMOS transistor and its corresponding NMOS transistor) is approximately 10% or less of the combined resistance of the CMOS transistor and the resistance of the one resistor $R_1$ through $R_X$ to which it is coupled in series. In one embodiment, one or more of resistors $R_1$ to $R_X$ may comprise a plurality of resistors. Thus, for example, resistor $R_1$ may comprise a plurality of resistors coupled in series.

Figure 4:
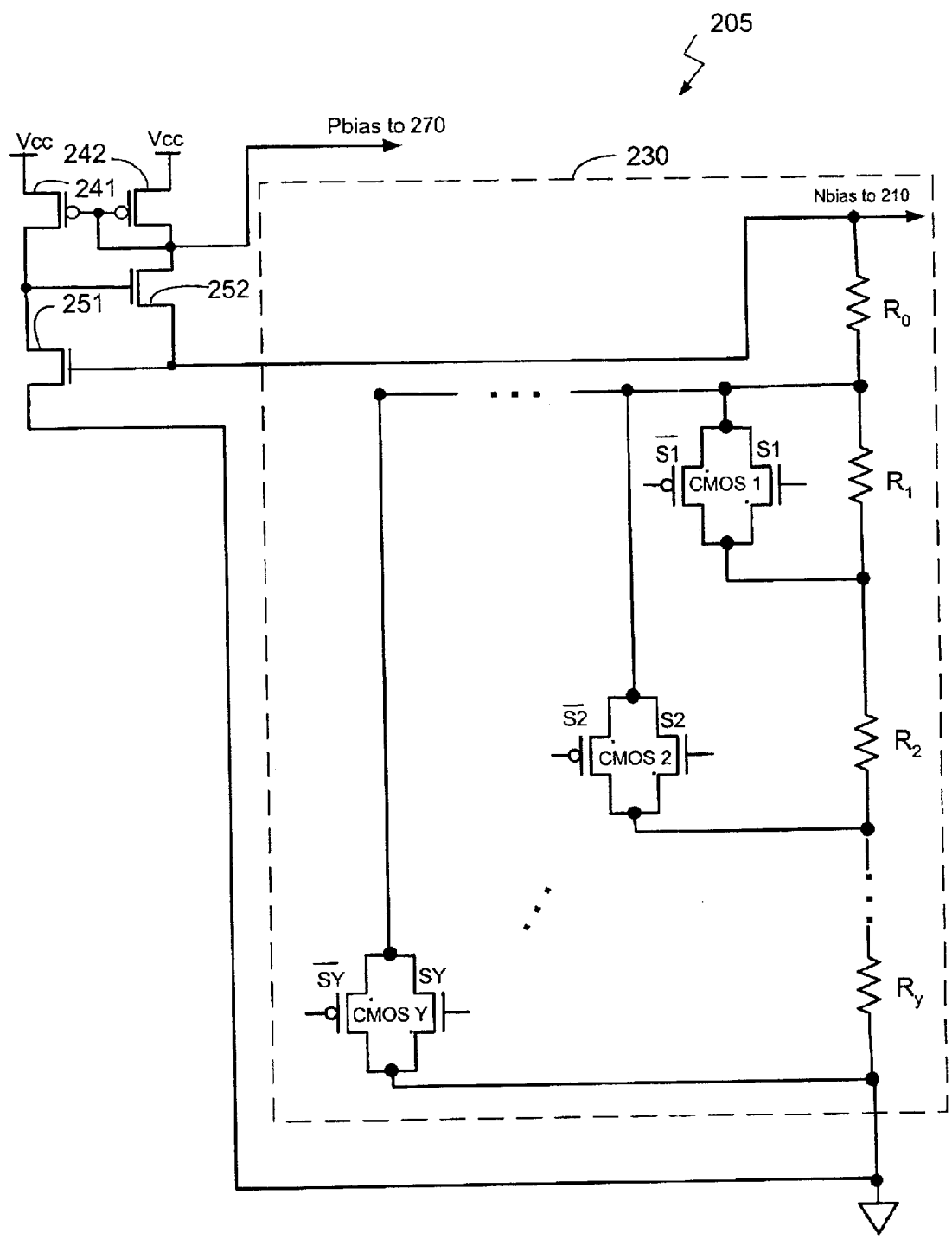
FIG. 4 is a circuit diagram of a second embodiment of the programmable current reference circuit of the present invention.

FIG. 4 is a detailed circuit diagram of a second embodiment of the programmable current reference circuit 205 of the present invention. In FIG. 4, resistors $R_0$ through $R_Y$ are coupled in series, where Y is an integer and in this specific embodiment is equal to or greater than 3. More generally, Y is an integer equal to or greater than 2. As can be seen in FIG. 4, CMOS transistors 1 through Y are coupled across one or more of the resistors $R_1$ through $R_Y$. As shown in FIG. 4, in one embodiment, resistor $R_0$, unlike resistors $R_1$ through $R_Y$, does not have a CMOS transistor coupled across it. In another embodiment, there may be a transistor CMOS0 coupled across resistor $R_0$. In one embodiment, the CMOS transistors have a relatively small resistance. This allows to effectively short around the desired resistors in the series $R_1$ through $R_Y$ to obtain the desired overall resistance. In one embodiment, all of the resistors $R_0$ through $R_Y$ have the same resistance. In another embodiment, each of the resistors $R_0$ and $R_Y$ has a different resistance. By turning on one or more of the appropriate CMOS transistors and turning off the remaining CMOS transistors, a desired overall resistance may be obtained.

Figure 5:
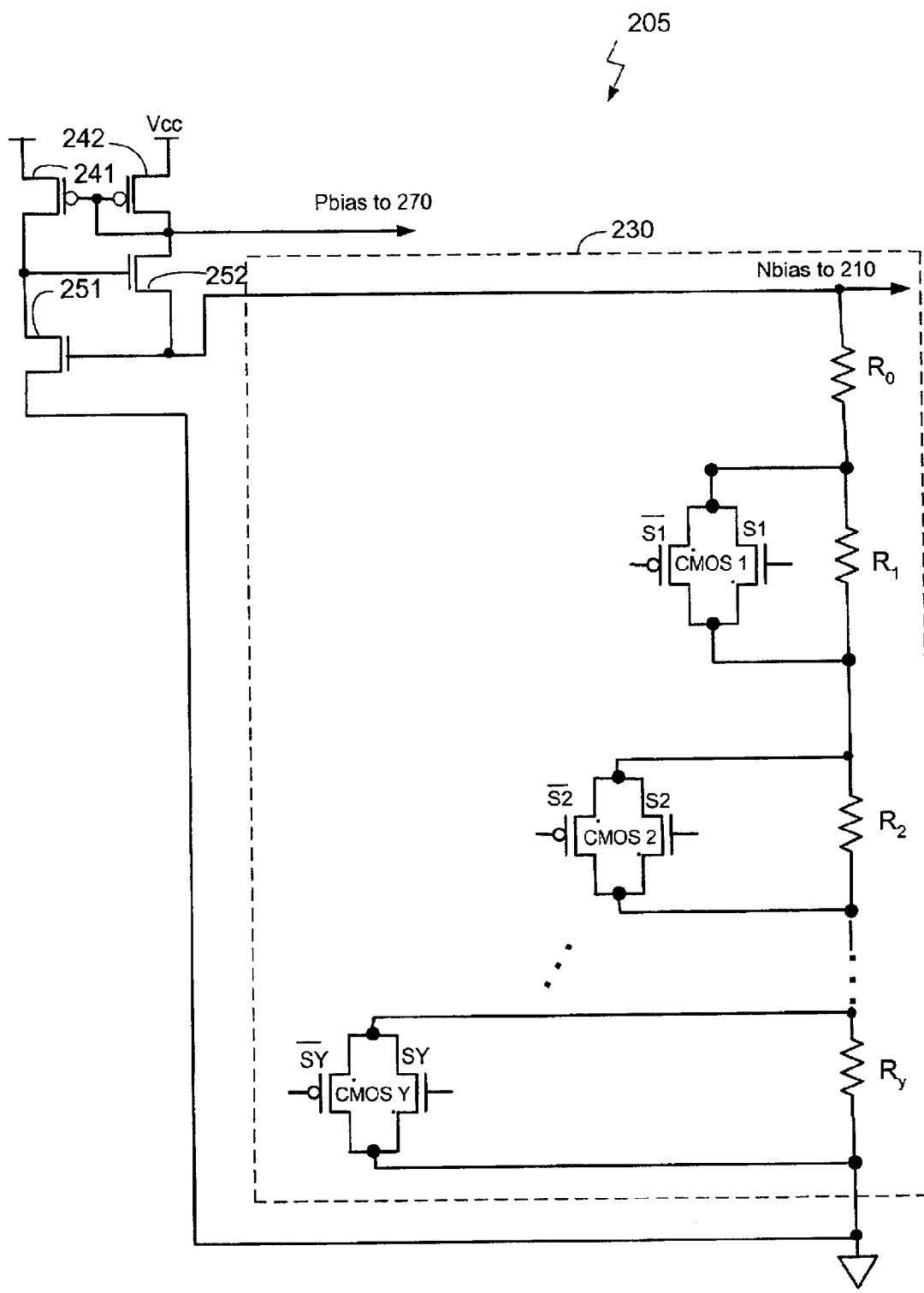
FIG. 5 is a circuit diagram of a third embodiment of the programmable current reference circuit of the present invention.

FIG. 5 is a detailed circuit diagram of a third embodiment of the programmable current reference circuit 205 of the present invention. In the embodiment shown in FIG. 5, each of CMOS transistors CMOS1 to CMOSY provides a shorting path around one, rather than a plurality, of resistors $R_1$ to $R_Y$. As can be seen in FIG. 5, transistors CMOS1 to CMOSY provide a shorting path around resistors $R_1$ to $R_Y$, respectively. As shown in FIG. 5, in one embodiment, resistor $R_0$, unlike resistors $R_1$ through $R_Y$, does not have a CMOS transistor coupled across it. In another embodiment, there may be a transistor CMOS0 coupled across resistor $R_0$.

In the embodiments shown in FIGS. 4 and 5, there are no CMOS transistors coupled in series with the resistors $R_1$ to $R_Y$. In another embodiment, there may be a CMOS transistor coupled in series with resistors $R_1$ to $R_Y$.

Figure 6A:
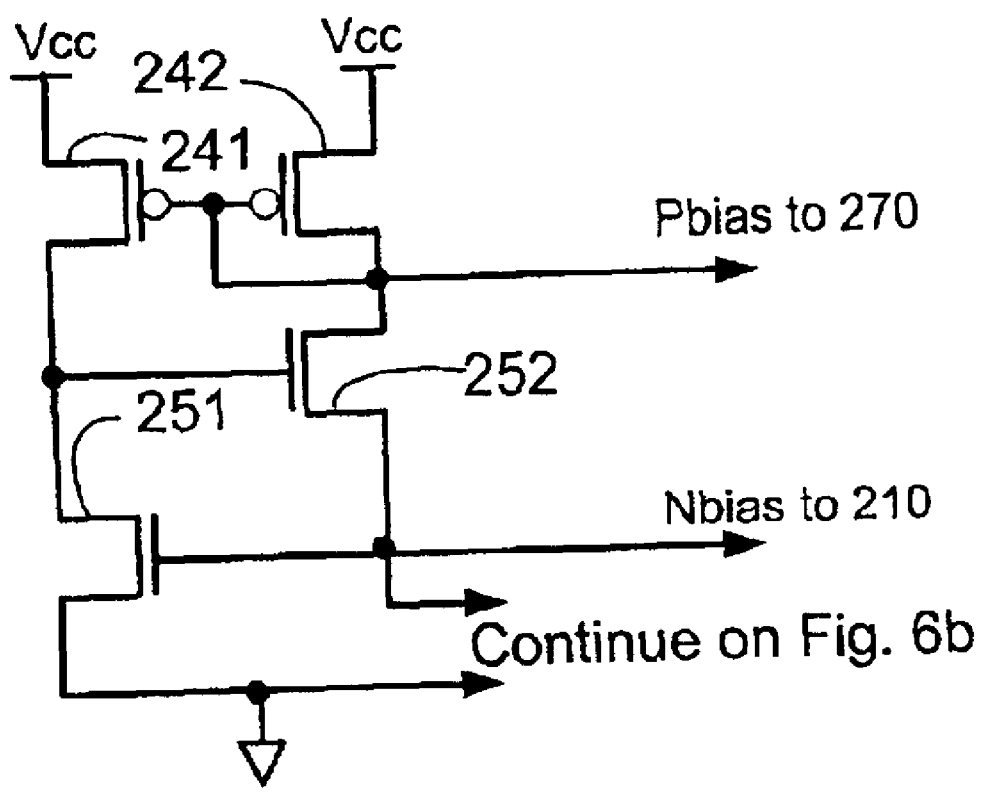
FIGS. 6a and 6b are a circuit diagram of a fourth embodiment of the programmable current reference circuit of the present invention.
Figure 6B:
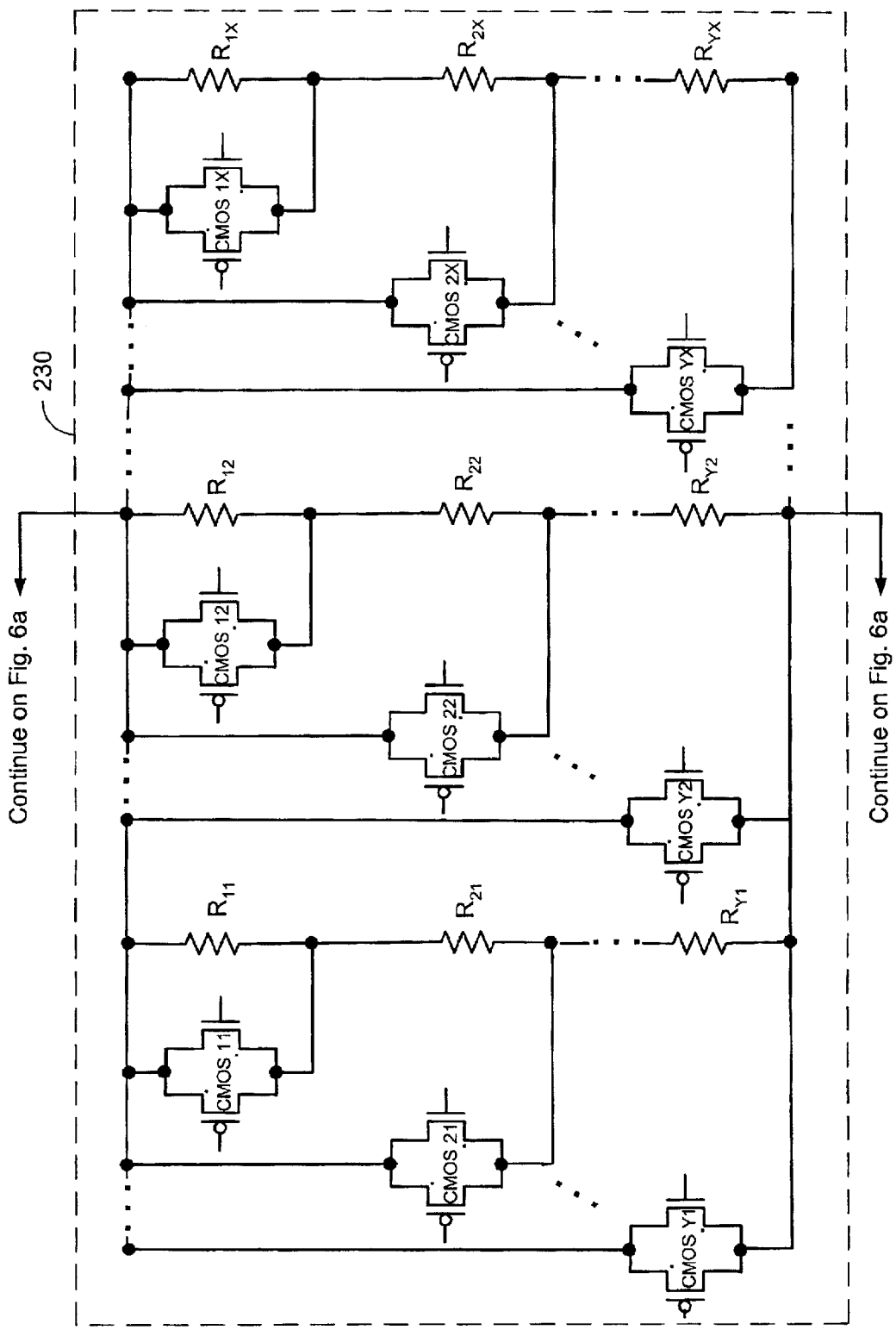

FIGS. 6a and 6b are a detailed circuit diagram of a fourth embodiment of the programmable current reference circuit 205 of the present invention. In the embodiment shown in FIGS. 6a and 6b, there is a combination of both parallel and serial resistances. By turning on one or more of the appropriate CMOS transistors and turning off the remaining CMOS transistors, a desired overall resistance may be obtained. As can be seen in FIG. 6b, turning on any one of CMOSY1 through CMOSYX would short all the resistors $R_{11}$ through $R_{YX}$. Thus, having only one of CMOSY1 through CMOSYX is sufficient for shorting all resistors $R_{11}$ through $R_{YX}$. In one embodiment, all of the resistors $R_{11}$ through $R_{YX}$ have the same resistance. In another embodiment, each of the resistors $R_{11}$ and $R_{YX}$ has a different resistance.

Figure 7A:
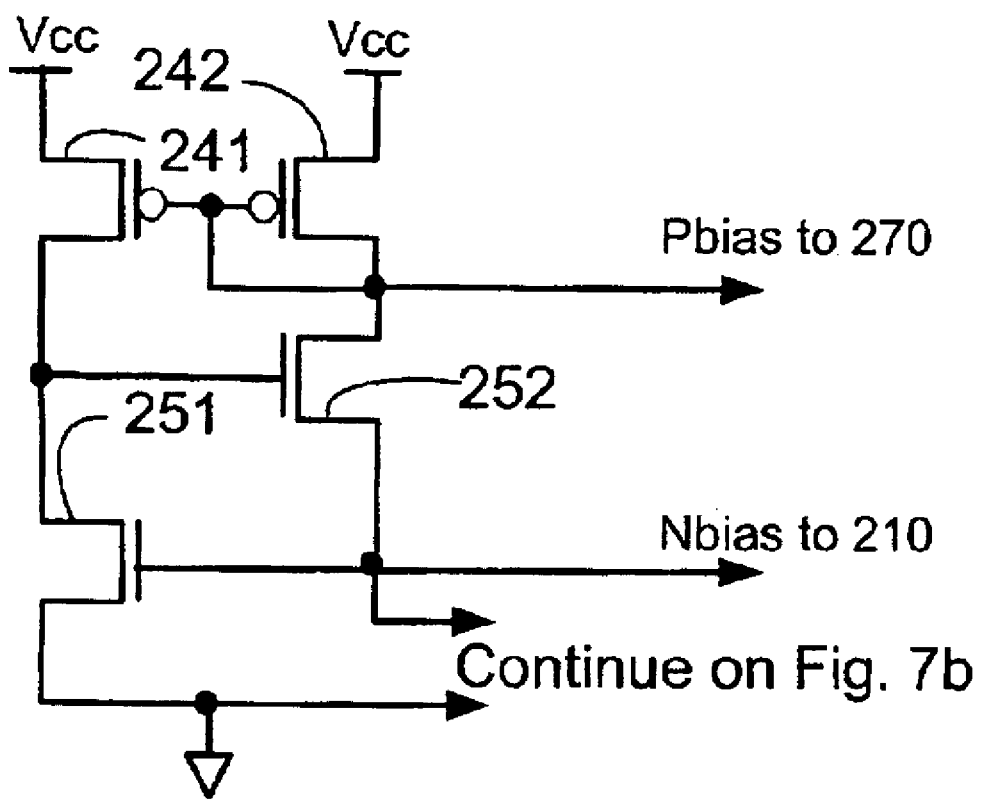
FIGS. 7a and 7b are a circuit diagram of a fifth embodiment of the programmable current reference circuit of the present invention.
Figure 7B:
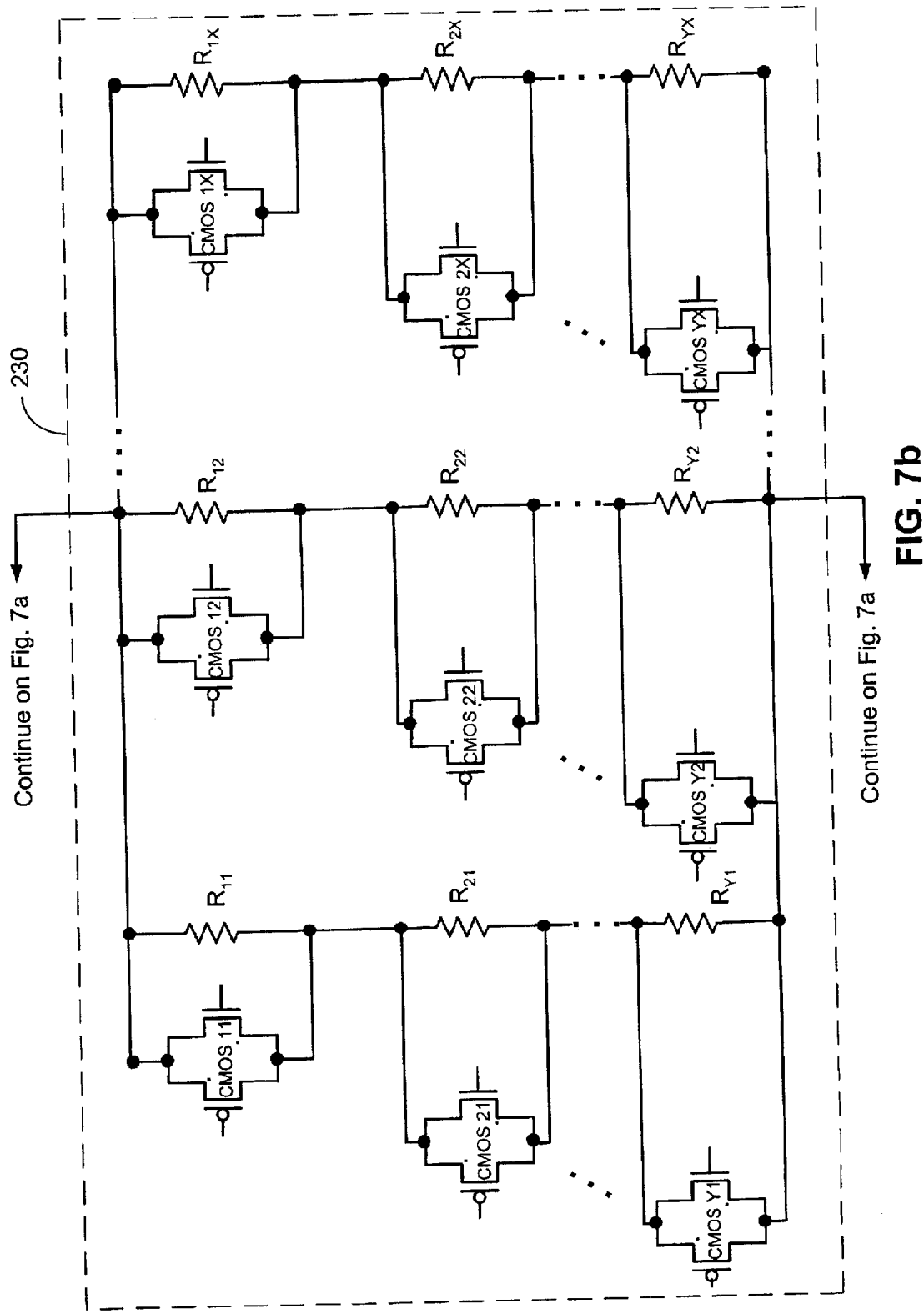

FIGS. 7a and 7b are a detailed circuit diagram of a fifth embodiment of the programmable current reference circuit 205 of the present invention. In FIGS. 7a and 7b, as in FIG. 5, each of the CMOS transistors provides a shorting path around one resistor. As can be seen in FIG. 7b, transistors CMOS 1 to CMOSYX provide a shorting path around resistors $R_{11}$ to $R_{YX}$, respectively.

In the embodiments shown in FIGS. 6a, 6b, 7a, and 7b, there are no CMOS transistors coupled in series with the resistors $R_{11}$ to $R_{YX}$. In another embodiment, there may be a CMOS transistor coupled in series with resistors $R_{11}$ to $R_{YX}$. In one such embodiment, there may be a CMOS transistor coupled in series with resistors $R_{11}$ to $R_{Y1}$. Similarly, each of the other series resistors $R_{12}$ to $R_{Y1}$, $R_{12}$ to $R_{Y2}$, ..., $R_{1X}$ to $R_{YX}$ may have a CMOS transistor coupled in series therewith.

As can be seen in FIGS. 3–5, 6b, and 7b, for each CMOS, e.g., CMOS1, the source of the PMOS transistor (e.g., transistor 301 in FIG. 3) is coupled to the drain of the NMOS transistor (e.g., transistor 302 in FIG. 3), while the drain of the PMOS transistor (e.g., transistor 301 in FIG. 3) is coupled to the source of the NMOS transistor (e.g., transistor 302 in FIG. 3). In another embodiment, some other switching device may be used in place of CMOS transistors. For example, single PMOS or NMOS transistors may be used rather than a combination of the PMOS transistor and NMOS transistor making up a CMOS transistor. In another embodiment, a fuse, rather than a transistor, may be used as a switch.

In one embodiment, the control values (e.g., bits) for turning on/off the CMOS transistors are stored in a random access memory (RAM). Of course, these control values are not limited to being stored in RAM. In one embodiment, the control values are stored in static RAM (SRAM). In another embodiment, the control values may be stored in some other type of memory, such as erasable programmable read only memory (XPROM) or electrically erasable programmable read only memory (EEPROM).

In one embodiment, shift registers 152 are coupled to the CMOS switches shown in FIGS. 3–5, 6b, and 7b. More specifically, in one embodiment, they are coupled to the gates of these CMOS switches. Accordingly, the outputs of the shift registers 152 determine the state of the CMOS switches and the overall resistance of resistor $R_{ref}$ 230. Therefore, using shift registers 152, resistor $R_{ref}$ 230 is programmable in user mode. In one embodiment, there are hold registers between the CMOS switches and shift registers 152. The hold registers receive data from shift registers 152. Thereafter, the hold registers supply the data to the CMOS switches.

The programmable reference current circuit 205 of the present invention may be used in a variety of different applications. For example, it may be used as a reference current circuit in a digital to analog converter, in an amplifier, or in a current bias circuit.

The PLL circuit of the present invention may be used in many systems. For example, the PLL circuit may be used in a digital system. More specifically, the PLL circuit may be used in a digital system comprising a programmable logic device (PLD), which as used herein also refers to complex PLD's (CPLD's). Additionally, the PLL circuit may be used in a PLD. In one embodiment, the PLL circuit is on the same die/chip as the PLD. In one embodiment, the programmable current reference circuit may be reprogrammed in user mode. Thus, in one embodiment, the loop filter bandwidth may be reprogrammed by reprogramming $R_{ref}$ to select a different bandwidth in real time while the PLD is in user mode. As used herein a digital system is not intended to be limited to a purely digital system, but also encompasses hybrid systems that include both digital and analog subsystems. Thus, the present invention encompasses digital systems that include the PLL circuit described herein.

While the present invention has been particularly described with respect to the illustrated embodiments, it will be appreciated that various alterations, modifications and adaptations may be made based on the present disclosure, and are intended to be within the scope of the present invention. While the invention has been described in connection with what are presently considered to be the most practical and preferred embodiments, it is to be understood that the present invention is not limited to the disclosed embodiment but, on the contrary, is intended to cover various modifications and equivalent arrangements included within the scope of the appended claims.

What is claimed is:

1. A programmable current reference circuit comprising:
   a programmable resistance, wherein the programmable resistance is programmable to provide a plurality of resistances coupled in parallel, wherein each of the plurality of resistances comprises a plurality of resistors coupled in series and each of the plurality of resistances corresponds to one of a plurality of programmable current reference circuit outputs; and a plurality of shorting routes, wherein each shorting route comprises a switch and is coupled across at least one resistor of the plurality of resistors.

2. The programmable current reference circuit of claim 1, wherein the programmable resistance is programmable in user mode.

3. The programmable current reference circuit of claim 1, wherein the plurality of programmable current reference circuit outputs comprises a plurality of reference currents.

4. The programmable current reference circuit of claim 1, wherein each resistance of the plurality of resistances further comprises a switch coupled in series with the plurality of resistors.

5. The programmable current reference circuit of claim 1 further comprising a current source coupled to said programmable resistance.

6. The programmable current reference circuit of claim 5, wherein the current source comprises a current mirror.

7. The programmable current reference circuit of claim 6, wherein the current mirror comprises a first transistor and a second transistor coupled to the first transistor.

8. A digital system including a programmable logic device and the programmable current reference circuit of claim 1.

9. A programmable logic device including the programmable current reference circuit of claim 1.

10. A digital to analog converter including the programmable current reference circuit of claim 1.

11. An amplifier including the programmable current reference circuit of claim 1.

12. A current bias circuit including the programmable current reference circuit of claim 1.

13. A programmable current reference circuit comprising:
a current source; and
a programmable resistance coupled to said current source, wherein the programmable resistance is programmable to provide:
a plurality of resistances coupled in parallel, wherein each resistance of the plurality of resistances comprises a plurality of resistors coupled in series; and
a plurality of shorting routes, wherein each shorting route comprises a switch and is coupled across at least one resistor of the plurality of resistors;
wherein each of the plurality of resistances corresponds to one of a plurality of programmable current reference circuit outputs.

14. The programmable current reference circuit of claim 13, wherein the plurality of programmable current reference circuit outputs comprises a plurality of reference currents.

15. The programmable current reference circuit of claim 13, wherein each resistance of the plurality of resistances further comprises a switch coupled in series with the plurality of resistors.

16. The programmable current reference circuit of claim 13, wherein the current source comprises a current mirror.

17. The programmable current reference circuit of claim 16, wherein the current mirror comprises a first transistor and a second transistor coupled to the first transistor.

18. A digital system including a programmable logic device and the programmable current reference circuit of claim 13.

19. A programmable logic device including the programmable current reference circuit of claim 13.

20. A digital to analog converter including the programmable current reference circuit of claim 13.

21. An amplifier including the programmable current reference circuit of claim 13.

22. A current bias circuit including the programmable current reference circuit of claim 13.

23. A phase locked loop circuit comprising:
a signal generator; and
a programmable current reference circuit coupled to said signal generator, wherein the programmable current reference circuit is programmable to provide one of a plurality of programmable current reference circuit outputs and comprises a current source and a programmable resistance coupled to the current source.

24. The phase locked loop circuit of claim 23, wherein the programmable resistance is programmable in user mode.

25. The phase locked loop circuit of claim 23, wherein the programmable resistance is programmable to provide one of a plurality of resistances, each resistance of the plurality of resistances corresponding to one of the plurality of programmable current reference circuit outputs.

26. The phase locked loop circuit of claim 23, wherein the plurality of current reference circuit outputs comprises a plurality of reference currents.

27. The phase locked loop circuit of claim 23, wherein the programmable resistance comprises a plurality of resistances coupled in parallel, wherein each resistance of the plurality of resistances comprises at least one resistor and a switch coupled in series with the at least one resistor.

28. The phase locked loop circuit of claim 23, wherein the programmable resistance comprises:
a plurality of resistors coupled in series; and
a plurality of shorting routes, wherein each shorting route comprises a switch and is coupled across at least one resistor of the plurality of resistors.

29. The phase locked loop circuit of claim 23, wherein the programmable resistance comprises:
a plurality of resistances coupled in parallel, wherein each resistance of the plurality of resistances comprises a plurality of resistors coupled in series; and
a plurality of shorting routes, wherein each shorting route comprises a switch and is coupled across at least one resistor of the plurality of resistors.

30. The phase locked loop circuit of claim 29, wherein each resistance of the plurality of resistances further comprises a switch coupled in series with the plurality of resistors.

31. The phase locked loop circuit of claim 23 further comprising a charge pump coupled to the signal generator, wherein the charge pump comprises the programmable current reference circuit.

32. The phase locked loop of claim 31 further comprising:
a detector coupled to the charge pump and the signal generator; and
a first divider coupled to the signal generator and a first input node of the detector, wherein the first divider receives a signal generator output signal from the signal generator and provides a first input signal to the first input node of the detector.

33. The phase locked loop of claim 32 further comprising:
a second divider coupled to a second input node of the detector; and
a third divider coupled to the signal generator;
wherein the second divider receives a reference clock signal and provides a second input signal to the second input node of the detector, further wherein the third divider receives the signal generator output signal from the signal generator and provides an output clock signal.

34. A digital system including a programmable logic device and the phase locked loop circuit of claim 23.

35. A programmable logic device including the phase locked loop circuit of claim 29.

36. A method of providing an output clock signal, the method comprising:
   programming a programmable current reference circuit to provide one of a plurality of programmable current reference circuit outputs;
   providing a control signal to a signal generator, wherein the control signal corresponds to the one of the plurality of programmable current reference circuit outputs; and
   generating an output clock signal in response to the control signal.

37. The method of claim 36, wherein the programming comprises selecting one of a plurality of resistances in a programmable current reference circuit, wherein each resistance of the plurality of resistances has a corresponding programmable current reference circuit output of the plurality of programmable current reference circuit outputs.

38. The method of claim 36, wherein the plurality of programmable current reference circuit outputs comprises a plurality of reference currents.

39. The method of claim 37 further comprising comparing a feedback clock signal with a reference clock signal.

* * * * *